(12) United States Patent
Tan et al.

(10) Patent No.: US 12,081,175 B2
(45) Date of Patent: Sep. 3, 2024

(54) OPERATIONAL AMPLIFIER AND ELECTRONIC SYSTEM

(71) Applicant: HANGZHOU GEO-CHIP TECHNOLOGY CO., LTD., Hangzhou (CN)

(72) Inventors: Chun Geik Tan, San Diego, CA (US); Sy-Chyuan Hwu, Hangzhou (CN); Ruili Wu, Hangzhou (CN); Yang Yang, Hangzhou (CN)

(73) Assignee: Hangzhou Geo-chip Technology Co., Ltd., Hangzhou (CN)

( * ) Notice: Subject to any disclaimer, the term of this patent is extended or adjusted under 35 U.S.C. 154(b) by 0 days.

(21) Appl. No.: 18/318,879

(22) Filed: May 17, 2023

(65) Prior Publication Data

US 2023/0378916 A1    Nov. 23, 2023

(30) Foreign Application Priority Data

May 18, 2022   (CN) .......................... 202210550436.2
Nov. 8, 2022   (CN) .......................... 202211389265.6

(51) Int. Cl.
*H03F 3/45*   (2006.01)
*H03F 1/32*   (2006.01)

(52) U.S. Cl.
CPC ....... *H03F 1/3205* (2013.01); *H03F 3/45179* (2013.01); *H03F 2200/451* (2013.01)

(58) Field of Classification Search
CPC ...................................................... H03F 3/45

(Continued)

(56) References Cited

U.S. PATENT DOCUMENTS 5,900,783 A * 5/1999 Dasgupta ............... H03F 3/3001
                                                    330/264
6,630,863 B2 * 10/2003 Tsuchiya ................. H03F 3/303
                                                    330/264

(Continued)

FOREIGN PATENT DOCUMENTS

CN         86103472 A      12/1986
CN        101155160 A       4/2008

(Continued)

OTHER PUBLICATIONS

First Office Action mailed Jan. 6, 2023 in Chinese Application No. 202210550436.2, with English translation, 10 pages.

(Continued)

*Primary Examiner* — Henry Choe
(74) *Attorney, Agent, or Firm* — Nixon & Vanderhye P.C.

(57) ABSTRACT

An operational amplifier, any of a pair of amplification circuits of its output-stage amplification circuit unit comprises: a first and second transistors, a capacitor and a DC bias circuit; a control electrode of the first transistor is connected with a corresponding output terminal of a preceding-stage amplification circuit unit, a first electrode thereof is connected with a first power terminal and a second electrode thereof is connected with an output terminal of an amplification circuit of the output-stage amplification circuit unit; an output terminal of the DC bias circuit is connected with a control electrode of the second transistor, a first electrode of which is connected with a second power terminal, and a second electrode thereof is connected with the output terminal; both ends of the capacitor are respectively connected with the control electrodes of the first and second transistors; and the first and second transistors are of opposite polarities.

19 Claims, 5 Drawing Sheets (58) Field of Classification Search
USPC .................................................. 330/255, 253
See application file for complete search history.

(56) References Cited

U.S. PATENT DOCUMENTS

| | | | | |
|---|---|---|---|---|
| 7,405,622 | B2* | 7/2008 | Nishimura | ............ H03F 3/3022 |
| | | | | 330/255 |
| 7,786,801 | B2* | 8/2010 | Kim | .................... H03F 3/45475 |
| | | | | 330/255 |
| 7,884,671 | B2* | 2/2011 | Chung | .................. H03F 3/3028 |
| | | | | 330/261 |
| 8,159,302 | B2* | 4/2012 | Yeh | ..................... H03F 3/45219 |
| | | | | 330/257 |
| 8,193,861 | B2* | 6/2012 | Tsuzaki | ............... H03F 3/45192 |
| | | | | 330/253 |
| 10,141,894 | B1 | 11/2018 | Aruppukottai Boominathan et al. | |
| 2004/0008084 | A1* | 1/2004 | Dvorak | ............... H03F 3/45179 |
| | | | | 330/264 |
| 2006/0103426 | A1 | 5/2006 | Lee et al. | |
| 2017/0187375 | A1 | 6/2017 | Madan et al. | |
| 2018/0248527 | A1 | 8/2018 | McLachlan et al. | |
| 2019/0158032 | A1 | 5/2019 | Takano et al. | |

FOREIGN PATENT DOCUMENTS

| | | |
|---|---|---|
| CN | 101373956 A | 2/2009 |
| CN | 105099474 A | 11/2015 |
| CN | 107276548 A | 10/2017 |
| CN | 107681994 A | 2/2018 |
| CN | 109067368 A | 12/2018 |
| CN | 111769828 A | 10/2020 |
| CN | 213783253 U | 7/2021 |
| CN | 113612449 A | 11/2021 |
| CN | 114421928 A | 4/2022 |
| EP | 1 885 135 A2 | 2/2008 |
| TW | 201442517 A | 11/2014 |
| TW | 201445872 A | 12/2014 |

OTHER PUBLICATIONS

Second Office mailed Feb. 3, 2023 in Chinese Application No. 202210550436.2, with English translation, 7 pages.

Lin et al., Design and Research of S-Band High Gain Drive Amplifier Based on GaAs pHEMT Process, Chinese Journal of Electron Devices, vol. 44, No. 4, Aug. 2021, pp. 802-805.

First Office Action mailed Feb. 3, 2023 in Chinese Application No. 202211389265.6, with English translation, 15 pages.

Second Office Action mailed Feb. 25, 2023 in Chinese Application No. 202211389265.6, with English translation, 11 pages.

Third Office Action mailed Oct. 30, 2023 in Chinese Application No. 202211389265.6, with English translation, 13 pages.

Ke et al., "A Lower Power Inverter-Based Sigma-Delta ADS for Audio Applications," Microelectronics and Computers (Monthly), vol. 33, Issue 8, Aug. 2016, 1 page.

Chen et al., "Design of Ultra-Wideband True-Time Delay Multi-Function Chip," Journal of Microwaves, vol. 34, No. 1, Feb. 2018, 5 pages.

* cited by examiner

OPERATIONAL AMPLIFIER AND ELECTRONIC SYSTEM

CROSS-REFERENCE TO RELATED PATENT APPLICATION

This application claims benefits of and priorities to Chinese Patent Application No. 202210550436.2 filed on May 18, 2022 and entitled "operational amplifier and electronic system", and Chinese Patent Application No. 202211389265.6 filed on Nov. 8, 2022 and entitled "open-loop compensation circuit for inverter-based operational amplifier, receiver and radio frequency transceiver", the disclosures of which are incorporated herein by reference in their entireties.

TECHNICAL FIELD

The present disclosure relates to the field of electronic circuit technologies, and in particular, to an operational amplifier and an electronic system.

BACKGROUND

A gain of an operational amplifier should be sufficiently high in order for good linearity of the operational amplifier. However, the bandwidth of the operational amplifier is limited, and moreover the gain of the operational amplifier with respect to high-frequency signals is relatively small and the corresponding linearity of the operational amplifier is poor. The traditional design strategy is to increase a circuit area and current consumption in the operational amplifier so as to shift the position of the non-dominant pole, so that the dominant pole may be placed at a higher frequency. However, such traditional design strategy is defective because the circuit area and the current consumption of the operational amplifier is limited and thus an increase thereof is limited.

SUMMARY

The present disclosure provides an operational amplifier and an electronic system, so that a gain of the operational amplifier at a high frequency band is increased even though a circuit area of the operational amplifier is limited, thereby improving the operational amplifier-based linearity.

The present disclosure further provides an open-loop compensation circuit for an inverter-based operational amplifier and an electronic system, so as to reduce the complexity of the chip and improve the amplification efficiency.

In one aspect of the disclosure, an operational amplifier is provided and may include at least two stages of amplification circuit units, including an output-stage amplification circuit unit and a preceding-stage amplification circuit unit at an upstream of the output-stage amplification circuit unit. The output-stage amplification circuit unit may include a pair of amplification circuits, each of which may include: a first transistor, a second transistor, a first capacitor and a first Direct Current (DC) bias circuit; a control electrode of the first transistor is connected with a corresponding output terminal of a preceding-stage amplification circuit unit, a first electrode of the first transistor is connected with a first power terminal, and a second electrode of the first transistor is connected with an output terminal of the amplification circuit including the first transistor; an output terminal of the first DC bias circuit is connected with a control electrode of the second transistor for providing a DC bias voltage to the control electrode of the second transistor; a first electrode of the second transistor is connected with a second power terminal, and a second electrode of the second transistor is connected with the output terminal of the amplification circuit; the two ends of the first capacitor are respectively connected with the control electrode of the first transistor and the control electrode of the second transistor; the first transistor and the second transistor are of opposite polarities.

The amplification circuit of the output-stage amplification circuit unit may further include: a first resistor and a second capacitor, where the first resistor and the second capacitor are connected in series between the control electrode of the first transistor and the second electrode of the first transistor.

The first DC bias circuit may include: a first current source and a third transistor, where a control electrode and a first electrode of the third transistor are both connected with the control electrode of the second transistor, a second electrode of the third transistor is connected with the second power terminal, an output terminal of the first current source is connected with the first electrode of the third transistor, and the third transistor and the second transistor are of the same polarity.

The control electrode of the third transistor may be connected with the control electrode of the second transistor via a second resistor.

The operational amplifier may further include a pair of low-frequency signal paths, each of which includes an input terminal connected with the corresponding output terminal of the preceding-stage amplification circuit unit and is configured for providing a low-frequency signal from the corresponding output terminal of the preceding-stage amplification circuit unit to the control electrode of the second transistor.

The low-frequency signal path may include: a fourth transistor, a fifth transistor and a second DC bias circuit; a control electrode of the fourth transistor is connected with the corresponding output terminal of the preceding-stage amplification circuit unit, a first electrode of the fourth transistor is connected with the first power terminal, and a second electrode of the fourth transistor is connected with the first electrode of the third transistor; the second DC bias circuit is configured for providing a DC bias voltage to a control electrode of the fifth transistor, a first electrode of the fifth transistor is connected with the second electrode of the fourth transistor, and a second electrode of the fifth transistor is connected with the second power terminal; the fourth transistor and the first transistor have the same polarity, and the fifth transistor and the second transistor have the same polarity.

The operational amplifier may include two stages of amplification circuit units, the preceding-stage amplification circuit unit functions as an input-stage amplification circuit unit, and the second DC bias circuit may include a sixth transistor, a seventh transistor, a third resistor and a fourth resistor; the resistance of the third resistor equals to that of the fourth resistor, a first end of the third resistor is connected with one output terminal of the input-stage amplification circuit unit, a second end of the fourth resistor is connected with the other output terminal of the input-stage amplification circuit unit, and a second end of the third resistor is connected with a first end of the fourth resistor; a control electrode of the sixth transistor is connected with the second end of the third resistor, a first electrode of the sixth transistor is connected with the first power terminal, and a second electrode of the sixth transistor is connected with a control electrode of the seventh transistor; the control electrode of the seventh transistor is further connected with the first electrode of the seventh transistor and the control electrode of the fifth transistor, and a second electrode of the seventh transistor is connected with the second power terminal; the polarity of the sixth transistor is the same as the polarity of the first transistor, and the polarity of the seventh transistor is the same as the polarity of the second transistor.

The input-stage amplification circuit unit may include: an eighth transistor, a ninth transistor, a tenth transistor, an eleventh transistor, a twelfth transistor, a thirteenth transistor, a fourteenth transistor and a third DC bias circuit, where a control electrode of the eighth transistor and a control electrode of the ninth transistor are respectively connected with two input terminals of the input-stage amplification circuit unit, and a first electrode of the eighth transistor and a first electrode of the ninth transistor are jointly connected with a first electrode of the twelfth transistor; the third DC bias circuit provides a DC bias voltage to a control electrode of the twelfth transistor, and a second electrode of the twelfth transistor is connected with the second power terminal; a control electrode of the thirteenth transistor is connected with a control electrode of the fourteenth transistor, a first electrode of the thirteenth transistor is connected with a second electrode of the ninth transistor, a first electrode of the fourteenth transistor is connected with a second electrode of the eighth transistor, a second electrode of the thirteenth transistor is connected with the first end of the third resistor, and a second electrode of the fourteenth transistor is connected with the second end of the fourth resistor; a control electrode of the eleventh transistor is connected with a control electrode of the tenth transistor, a first electrode of the tenth transistor and a first electrode of the eleventh transistor are both connected with the first power terminal, a second electrode of the tenth transistor is connected with the second electrode of the fourteenth transistor, and a second electrode of the eleventh transistor is connected with the second electrode of the thirteenth transistor; the polarities of the tenth transistor and the eleventh transistor are the same as the polarity of the first transistor, and the polarities of the thirteenth transistor, the fourteenth transistor, the eighth transistor, the ninth transistor and the twelfth transistor are the same as the polarity of the second transistor.

The first transistor may be a PMOS transistor, the second transistor may be an N-channel metal oxide semiconductor (NMOS) transistor, and the voltage at the first power terminal may be higher than the voltage at the second power terminal.

In another aspect of the disclosure, there provides an electronic system, which includes an operational amplifier according to the embodiments of the disclosure. In some embodiments, the electronic system may be, for example, an electronic module, or an electronic terminal product.

In yet another aspect of the disclosure, an open-loop compensation circuit for an inverter-based operational amplifier is provided and may include a baseband amplifying circuit and a common-mode compensation loop connected to an input of the baseband amplifying circuit, with an input of the common-mode compensation loop being connected to an output of a mixer, and an output of the common-mode compensation loop being connected to the input of the baseband amplifying circuit, where the baseband amplifying circuit has a first input terminal configured to receive a first input signal, and a second input terminal configured to receive a second input signal, and the common-mode compensation loop is configured to inversely amplify a differential signal between the first input signal and the second input signal to suppress common-mode noise.

In some embodiments, the common-mode compensation loop has a first input terminal connected to a first output terminal of the mixer, and a second input terminal connected to a second output terminal of the mixer, and has a first output terminal connected to the first input terminal of the baseband amplifying circuit, and a second output terminal connected to the second input terminal of the baseband amplifying circuit.

In some embodiments, the common-mode compensation loop includes an inverting amplifier, a first circuit part and a second circuit part, where the first circuit part has an output connected to an input of the inverting amplifier, the second circuit part has an input connected to an output of the inverting amplifier, and the second circuit part is a variable output circuit.

In some embodiments, the common-mode compensation loop includes:
   a first compensation loop configured as a first resistor and a second resistor for forming the first compensation loop with the inverting amplifier;
   a second compensation loop configured as a third resistor and a fourth resistor for forming the second compensation loop with the inverting amplifier; and
   a differential part circuit configured as a fifth resistor and a sixth resistor for forming a reference voltage loop with the inverting amplifier.

In some embodiments, provided that an i-th resistor has a resistance of Ri, a j-th resistance coefficient is Kj, a first resistance coefficient is defined by $$K1 = \frac{R3}{R3 + R4},$$

a second resistance coefficient is defined by $$K2 = \frac{R6}{R5},$$

and a third resistance coefficient is defined by $$K3 = \frac{R1}{R2};$$

the inverting amplifier has an output voltage Vcm determined by a differential signal Vop, a reference voltage Vref, the first resistance coefficient K1 and the second resistance coefficient K2; the baseband amplifying circuit has an output voltage Vout determined by the differential signal Vop, the reference voltage Vref, the first resistance coefficient K1, the second resistance coefficient K2 and the third resistance coefficient K3.

In some embodiments, the output voltage Vcm of the inverting amplifier is determined by a difference between values of a first operator and a second operator, where the first operator is expressed as (1+K2)*Vop*K1, and the second operator is expressed as K2*Vref.

In some embodiments, the output voltage Vout of the baseband amplifying circuit is determined by a sum of values of a third operator and a fourth operator, where the third operator is expressed as [(1+K3)−(1+K2)*K1*K3]*Vop, and the fourth operator is expressed as K3*K2*Vref.

In some embodiments, the baseband amplifying circuit includes an amplifier and two third circuit parts, with each of the third circuit parts having an input connected to an input of the amplifier, and an output connected to an output of the amplifier.

In some embodiments, the amplifier is said operational amplifier.

In some embodiments, each of the third circuit parts includes a resistor and a capacitor connected in parallel.

In yet another aspect of the disclosure, there provides an electronic system including said open-loop compensation circuit. In some embodiments, the electronic system may be, for example, a receiver or a radio frequency transceiver.

In yet another aspect of the disclosure, there provides a receiver including a receiving antenna, said open-loop compensation circuit, and an analog-to-digital converter that are connected in sequence.

In yet another aspect of the disclosure, there provides a radio frequency transceiver including a digital-to-analog converter, said open-loop compensation circuit, and a transmitting antenna that are connected in sequence.

With the above technical solutions of the present application, the following advantages are achieved.

Taking an operational amplifier having two stages of amplification circuit units as an example in which the preceding-stage amplification circuit unit functions as the input-stage amplification circuit unit, the high-frequency Alternating Current (AC) signal output by one output terminal of the input-stage amplification circuit unit is not only applied to the gate of the first transistor (which may be, for example, a PMOS transistor) of the corresponding amplification circuit in the output-stage amplification circuit unit, but also applied to the gate of the second transistor (which may be, for example, an NMOS transistor) of the amplification circuit via a first capacitor, which has an impedance that is ignorable for a high-frequency signal. The DC operating points of the first transistor and the second transistor are configured independently, so that both the first and second transistor can operate in an optimal amplification state, thus the linearity of the output stage of the operational amplifier may be greatly improved. The first transistor and the second transistor can both provide a high-frequency output current to the output terminal of the operational amplifier, so that the current drive capability of the operational amplifier on the high-frequency signal may be enhanced, and the open-loop voltage gain of the operational amplifier on the high-frequency signal may be increased.

In addition, the above open-loop compensation circuit includes a baseband amplifying circuit and a common-mode compensation loop connected to an input of the baseband amplifying circuit, where the baseband amplifying circuit has a first input terminal configured to receive a first input signal, and a second input terminal configured to receive a second input signal, so that the common-mode compensation loop could inversely amplify the differential signal between the two input signals to suppress common-mode noise. For the signal output by the output terminals of the mixer, the present disclosure could directly suppress the common-mode signal based on the common-mode compensation loop, so that the suppressed common-mode signal could facilitate maximizing of the amplification performance of the baseband amplifying circuit to thereby achieve a higher amplification efficiency. In addition, the problems caused by the traditional wrap-around type of common-mode feedback circuit CMFB requiring a precise and complex structure are avoided, thus achieving lower complexity and higher applicability of the chip.

The above summarization is merely used for illustrating the disclosure, rather than limiting the disclosure in any way. In addition to the above illustrative aspects, embodiments and features, further aspects, embodiments and features of the disclosure can be made apparent by referring to the drawings and the detailed description below.

BRIEF DESCRIPTION OF THE DRAWINGS

In the drawings, unless otherwise specified, the same labels represent the same or similar components or elements throughout the drawings. These drawings are not necessarily drawn in scale. It should be understood that these drawings only show some illustrative embodiments of the disclosure and should not be considered as limiting the scope of the disclosure. That is, the drawings are provided for better understanding the solutions of the disclosure, rather than limiting the disclosure. In the drawings.

DETAILED DESCRIPTION OF THE EMBODIMENTS

In the following description, only some exemplary embodiments are described. As will be appreciated by one skilled in the art, the described embodiments may be modified in various ways without departing from the scope of the present application. Therefore, the drawings and descriptions are essentially illustrative, rather than being restrictive.

In addition, the terms "first" and "second" are merely used for differentiating technical features for the purpose of illustration, but are not intended to indicate or imply the importance of these technical features or implicitly show the number of these technical features. Thus, technical features defined by the terms "first" and "second" may explicitly or implicitly include one or more of the technical features. In the description of the present application, the expression of "a plurality of" means two or more, unless otherwise specified.

The following disclosure provides various embodiments or examples for illustrating the implementation of various structures of the present disclosure. In order to simplify the disclosure of the present application, components and arrangements of specific examples are described below. Of course, these examples are merely illustrative, but not intended to limit the present disclosure. In addition, the same reference numerals may be used throughout different examples for the sake of simplification and clarity. Additionally, examples of various specific processes and materials are provided in the present application, but the application of other processes and/or other materials may readily occur to one of ordinary skills in the art.

In the disclosure, it should be understood that terms such as "include" and "comprise" indicate the existence of the characteristics, figures, steps, actions, components and parts disclosed in the disclosure or combinations thereof, without excluding the existence of one or more other characteristics, figures, steps, actions, components, parts or combinations thereof.

It should be noted that, in absence of conflicts, the embodiments of the disclosure and the features in the embodiments may be combined with each other. Hereinafter, the disclosure will be illustrated in detail by referring to the drawings and in conjunction with the embodiments.

The disclosure will be further illustrated below in conjunction with the embodiments shown in the drawings.

Figure 1:
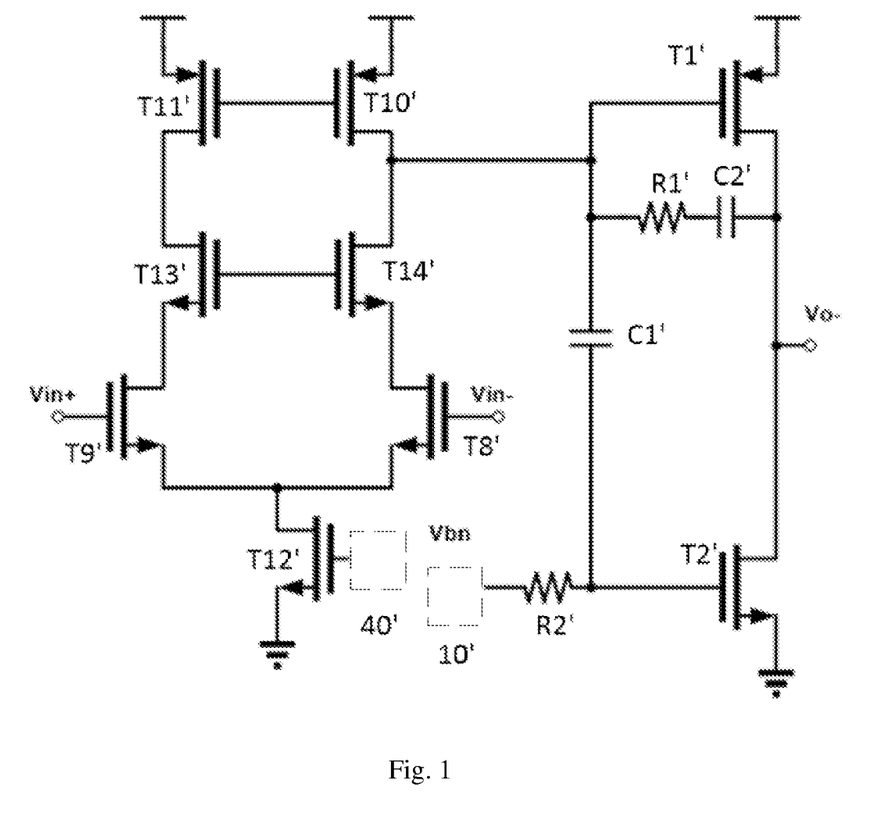
FIG. 1 is a structural representation of an operational amplifier according to embodiments of the disclosure.

FIG. 1 is a structural representation of an operational amplifier according to embodiments of the disclosure. In the embodiments, the operational amplifier includes an input-stage amplification circuit unit and an output-stage amplification circuit unit, and the output-stage amplification circuit unit may include a pair of amplification circuits. In FIG. 1, only one of the pair of amplification circuits of the output-stage amplification circuit unit of the operational amplifier is illustratively shown, but the other one of the pair of amplification circuits would be apparent to those skilled in the art due to its similarity to the shown one of the pair of amplification circuits.

As shown in FIG. 1, the input-stage amplification circuit unit may include an eighth transistor T8' and a ninth transistor T9' (both may be NMOS transistors, for example) for receiving differential input voltages. Here, gates of the eighth transistor T8' and the ninth transistor T9' are configured for receiving a differential input voltage Vin- and a differential input voltage Vin+, respectively, sources of the eighth transistor T8' and the ninth transistor T9' are connected to a drain of a twelfth transistor T12' (which may be, for example, an NMOS transistor), a source of the twelfth transistor T12' is grounded, and a gate of the twelfth transistor T12' is connected to a DC bias circuit 40' so that the DC bias circuit 40' may provide a DC bias voltage to the gate of the twelfth transistor T12'.

The input-stage amplification circuit unit may further include an eleventh transistor T11' (which may be, for example, a PMOS transistor), a tenth transistor T10' (which may be, for example, a PMOS transistor), a thirteenth transistor T13' (which may be, for example, an NMOS transistor) and a fourteenth transistor T14' (which may be, for example, an NMOS transistor). The gates of the eleventh transistor T11' and the tenth transistor T10' are connected with each other, and the gates of the thirteenth transistor T13' and the fourteenth transistor T14' are connected with each other. The sources of the eleventh transistor T11' and the tenth transistor T10' are connected to a power terminal, while the drains thereof are respectively connected to the drains of the thirteenth transistor T13' and the fourteenth transistor T14'. The sources of the thirteenth transistor T13' and the fourteenth transistor T14' are respectively connected to the drain of the ninth transistor T9' and the eighth transistor T8'. The drains of the tenth transistor T10' and the fourteenth transistor T14' may be connected to the gate of a first transistor T1' (which may be, for example, a PMOS transistor) of the output-stage amplification circuit unit.

In FIG. 1, the shown amplification circuit of the output-stage amplification circuit unit may include a first transistor T1' (which may be, for example, a PMOS transistor), a second transistor T2' (which may be, for example, an NMOS transistor), a first resistor R1', a second resistor R2', a first capacitor C1' and a second capacitor C2'. The source of the first transistor T1' is connected to the power terminal, the gate of the first transistor T1' is connected to first ends of the first resistor R1' and the first capacitor C1', and the drain of the first transistor T1' is connected to a second end of the second capacitor C2', a voltage output terminal of the output-stage amplification circuit unit and the drain of the second transistor T2'. A second end of the first resistor R1' is connected to a first end of the second capacitor C2'. A second end of the first capacitor C1' is connected to a second end of the second resistor R2' and the gate of the second transistor T2'. A first end of the second resistor R2' is connected to a DC bias circuit 10' configured to provide a DC bias voltage Vbn to the second resistor R2'.

The input-stage amplification circuit unit and one of the pair of amplification circuits of the output-stage amplification circuit unit are shown in FIG. 1. In order to improve the current drive capability of the output-stage amplification circuit unit with respect to a high-frequency signal, the first capacitor is disposed in the amplification circuit to connect the output terminal of the input-stage amplification circuit unit (i.e., the drains of the tenth transistor T10' and the fourteenth transistor T14') and the gate of the second transistor T2', so that a high-frequency signal output by the input-stage amplification circuit unit can be applied to both the gate of the first transistor T1' and the gate of the second transistor T2'. DC operating points of the first transistor T1' and the second transistor T2' are configured independently, so that both the first transistor T1' and the second transistor T2' can operate in their respective optimal amplification states, thus the linearity of the output stage of the operational amplifier is significantly improved. Both of the first transistor T1' and the second transistor T2' can provide a high-frequency output current to the output terminal of the operational amplifier, so that the current drive capability of the operational amplifier with respect to the high-frequency signal is enhanced, thereby increasing the open-loop voltage gain of the operational amplifier with respect to the high-frequency signal.

In FIG. 1, the first resistor R1' and the second capacitor C2' form a negative feedback path from the output terminal of the output-stage amplification circuit unit to the input terminal thereof.

In the embodiment shown in FIG. 1, the low-frequency signal and the DC signal output by the input-stage amplification circuit unit are blocked by the first capacitor C1' and can only be applied to the gate of the first transistor T1'. That is, the circuit in the embodiment can significantly improve the open-loop voltage gain for only the high-frequency signal.

Figure 2:
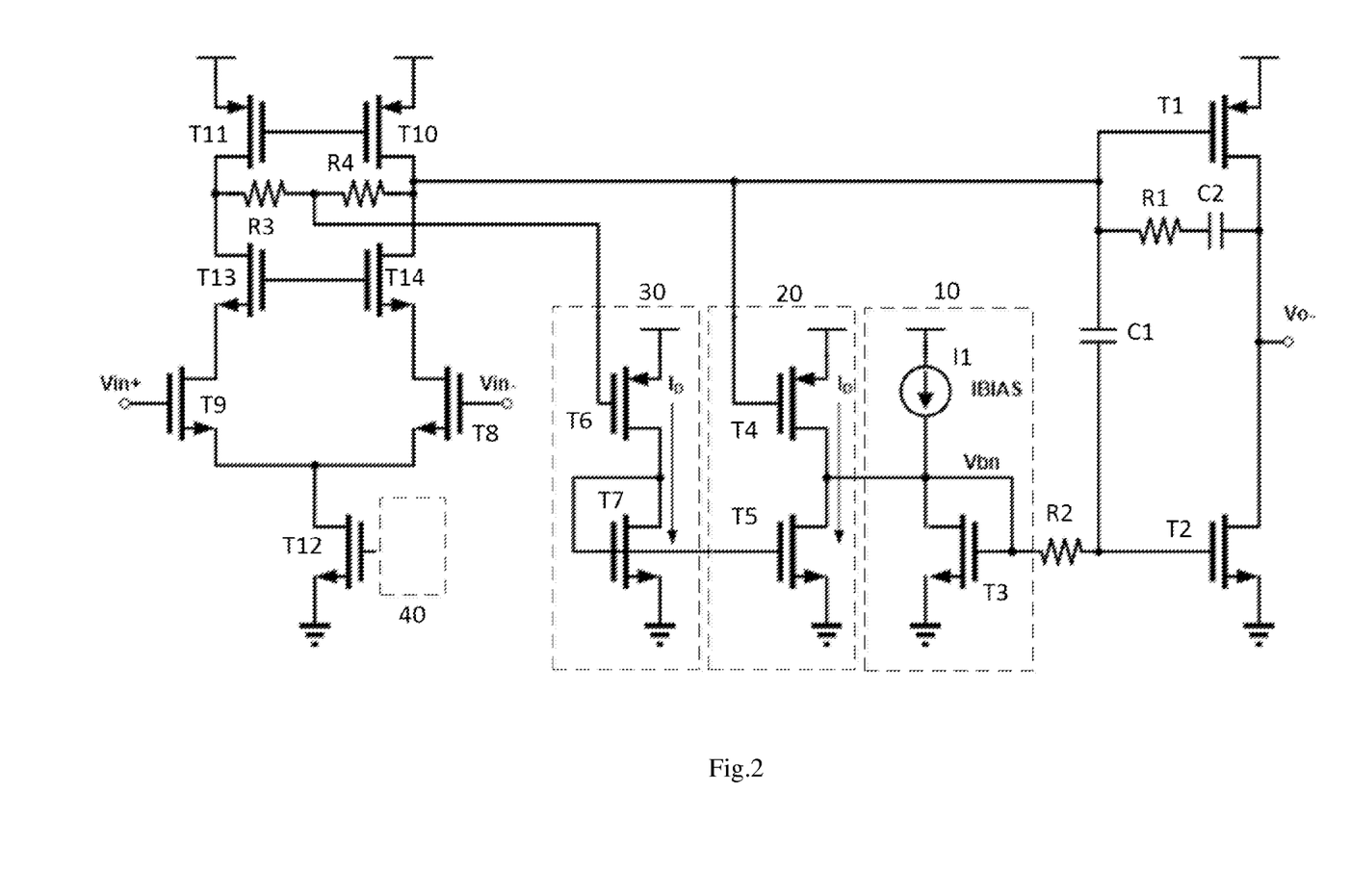
FIG. 2 is a structural representation of an operational amplifier according to embodiments of the disclosure.

FIG. 2 is a structural representation of an operational amplifier according to embodiments of the disclosure. In the embodiments, the operational amplifier includes an input-stage amplification circuit unit and an output-stage amplification circuit unit. The output-stage amplification circuit unit may include a pair of amplification circuits. In FIG. 2, only one of the pair of amplification circuits of the output-stage amplification circuit units of the operational amplifier is shown, but the other one of the pair of amplification circuits would be apparent to those skilled in the art due to its similarity to the shown one of the pair of amplification circuits.

As shown in FIG. 2, the input-stage amplification circuit unit may include an eighth transistor T8 (which may be, for example, an NMOS transistor) and a ninth transistor T9 (which may be, for example, a PMOS transistor) which are configured for receiving differential input voltages, where gates of the eighth transistor T8 and the ninth transistor T9 are configured for receiving a differential input voltage Vin− and a differential input voltage Vin+, respectively. Sources of the eighth transistor T8 and the ninth transistor T9 are connected to a drain of a twelfth transistor T12 (which may be, for example, an NMOS transistor). A source of the twelfth transistor T12 is grounded, and a gate of the twelfth transistor T12 is connected to a DC bias circuit 40 configured to provide a DC bias voltage to the twelfth transistor T12.

The input-stage amplification circuit unit may further include an eleventh transistor T11 (which may be, for example, a PMOS transistor), a tenth transistor T10 (which may be, for example, a PMOS transistor), a thirteenth transistor T13 (which may be, for example, an NMOS transistor), a fourteenth transistor T14 (which may be, for example, an NMOS transistor), a third resistor R3 and a fourth resistor R4. Gates of the eleventh transistor T11 and the tenth transistor T10 are connected with each other, and gates of the thirteenth transistor T13 and the fourteenth transistor T14 are connected with each other. Sources of the eleventh transistor T11 and the tenth transistor T10 are connected to a power terminal, and drains of the eleventh transistor T11 and the tenth transistor T10 are respectively connected to drains of the thirteenth transistor T13 and the fourteenth transistor T14. Sources of the thirteenth transistor T13 and the fourteenth transistor T14 are respectively connected to drains of the ninth transistor T9 and the eighth transistor T8. The drains of the tenth transistor T10 and the fourteenth transistor T14 may be connected to a gate of a first transistor T1 in the corresponding one of the pair of the amplification circuits of the output-stage amplification circuit unit. The third resistor R3 and the fourth resistor R4 connected in series. Here, a first end of the third resistor R3 is connected to the drains of the eleventh transistor T11 and the thirteenth transistor T13, a second end of the fourth resistor R4 is connected to the drains of the tenth transistor T10 and the fourteenth transistor T14, a second end of the third resistor R3 and a first end of the fourth resistor R4 are both connected to a gate of a sixth transistor T6 in a second DC bias circuit 30.

As shown in FIG. 2, each amplification circuit of the output-stage amplification circuit unit may include the first transistor T1 (which may be, for example, a PMOS transistor), a second transistor T2 (which may be, for example, an NMOS transistor), a first resistor R1, a second resistor R2, a first capacitor C1 and a second capacitor C2. A source of the first transistor T1 is connected to the power terminal, the gate of the first transistor T1 is connected to first ends of the first resistor R1 and the first capacitor C1 as well as the drains of the tenth and fourteenth transistors T10 and T14, and a drain of the first transistor T1 is connected to a second end of the second capacitor C2, a voltage output terminal of the output-stage amplification circuit unit, and a drain of the second transistor T2. A second end of the first resistor R1 is connected to a first end of the second capacitor C2. A second end of the first capacitor C1 is connected to a second end of the second resistor R2 and the gate of the second transistor T2. A first end of the second resistor R2 is connected to a DC bias circuit 10.

The DC bias circuit 10 includes a current source I1 and a third transistor T3 (which may be, for example, an NMOS transistor). A first end of the current source I1 is connected to the power terminal, and a second end of the current source I1 is connected to a drain and a gate of the third transistor T3. The gate of the third transistor T3 is further connected to drains of a fourth transistor T4 and a fifth transistor T5 in a DC bias circuit 20. The gate of the third transistor T3 may provide a DC bias voltage Vbn to the second resistor R2. A source of the third transistor T3 is grounded.

According to the embodiments, the operational amplifier further includes a low-frequency signal path which is composed by the DC bias circuit 20 and the second DC bias circuit 30. The DC bias circuit 20 includes a fourth transistor T4 (which may be, for example, a PMOS transistor) and a fifth transistor T5 (which may be, for example, an NMOS transistor). A gate of the fourth transistor T4 is connected to the drains of the tenth transistor T10 and the fourteenth transistor T14, a source of the fourth transistor T4 is connected to the power terminal, and a drain of the fourth transistor T4 is connected to a drain of the fifth transistor T5. A source of the fifth transistor T5 is grounded, and a gate thereof is connected to drains of the sixth transistor T6 and a seventh transistor T7 in the second DC bias circuit 30.

The DC bias circuit 30 is composed by the sixth transistor T6 (which may be, for example, a PMOS transistor) and the seventh transistor T7 (which may be, for example, an NMOS transistor). The source of the sixth transistor T6 is connected to the power terminal, and the gate thereof is connected to the second end of the third resistor R3 and the first end of the fourth resistor R4, while the drain of the sixth transistor T6 is connected to the drain and the gate of the seventh transistor T7. The source of the seventh transistor T7 is grounded.

In the embodiments, the output terminal of the input-stage amplification circuit unit, for example, the drain of the tenth transistor T10, is additionally connected with the gate of the fourth transistor T4, so that a low-frequency signal or DC signal output by the input-stage amplification circuit unit acts on the gate of the fourth transistor T4 so as to generate a response at the drain of the fourth transistor T4, thereby affecting the voltage at the gate of the second transistor T2. In this way, the low-frequency signal or DC signal output by the input-stage amplification circuit unit can be applied to both the gate of the first transistor T1 and the gate of the second transistor T2, thus the current drive capability of the output-stage amplification circuit unit can be improved, and the open-loop voltage gain of the operational amplifier can be improved.

The third resistor R3 may have a resistance equal to that of the fourth resistor R4. Since the first end of the third resistor R3 and the second end of the fourth resistor R4 receive differential output voltages generated by the input-stage amplification circuit unit, and the voltage at the second end of the third resistor R3 and the first end of the fourth resistor R4 (that is, the gate of the sixth transistor T6) is always maintained to be of a fixed value. Thus, the DC bias voltage for the gate voltage of the sixth transistor T6 is equal to the DC bias voltage for the gate voltage of the fourth transistor T4, that is, the gate voltage of the sixth transistor T6 is equal to the gate voltage of the fourth transistor T4 when the DC bias voltages are applied. Because the seventh transistor T7 and the fifth transistor T5 form a pair of 1:1 current mirrors, the DC current of the fourth transistor T4 fully flows to the fifth transistor T5, so that the DC operating point of the second transistor T2 depends on merely the DC current IBIAS of the third transistor T3. The DC operating point of the first transistor T1 is determined by the operating point of the input-stage amplification circuit unit. In this way, the DC operating points of the first transistor T1 and the second transistor T2 can be set separately so as to achieve the optimal linearity of the operational amplifier. In addition, the low-frequency signal from the input-stage amplification circuit unit (for which the first capacitor C1 operates in a nearly open state) can also be transmitted to the second transistor T2 via the fourth transistor T4.

The above description only shows a specific implementation of applying a low-frequency signal or DC signal generated by the input-stage amplification circuit unit to the gate of the second transistor T2.

It should be noted that, the type of each transistor and the polarity of the power supply in the above embodiments may be changed. For example, the PMOS transistor may be changed to an NMOS transistor, the NMOS transistor may be changed to a PMOS transistor, and a power source supplying a positive voltage may be changed to a power source supplying a negative voltage. All such changes to the above embodiments are well known in the art, and thus the description thereof is omitted herein.

It should be noted that the solution of the present disclosure is advantageous by the improvement in the output-stage amplification circuit unit, and is also applicable to an operational amplifier including more than two stages, e.g. an operational amplifier including an input-stage amplification circuit unit, one or more intermediate-stage amplification circuit unit, and an output-stage amplification circuit unit.

In the embodiments described in combination with the drawings, although the output-stage amplification circuit unit is preceded by the input-stage amplification circuit unit, the amplification circuit unit preceding the output-stage amplification circuit unit may be an intermediate-stage amplification circuit unit.

Embodiments of the disclosure further provides an electronic system, which includes the above-described operational amplifier. The electronic system may be an electronic module or an electronic terminal product. For example, the electronic system may be an electronic module such as an analog filter, a receiver or a radio frequency transceiver or an electronic terminal product such as a mobile phone.

Figure 3:
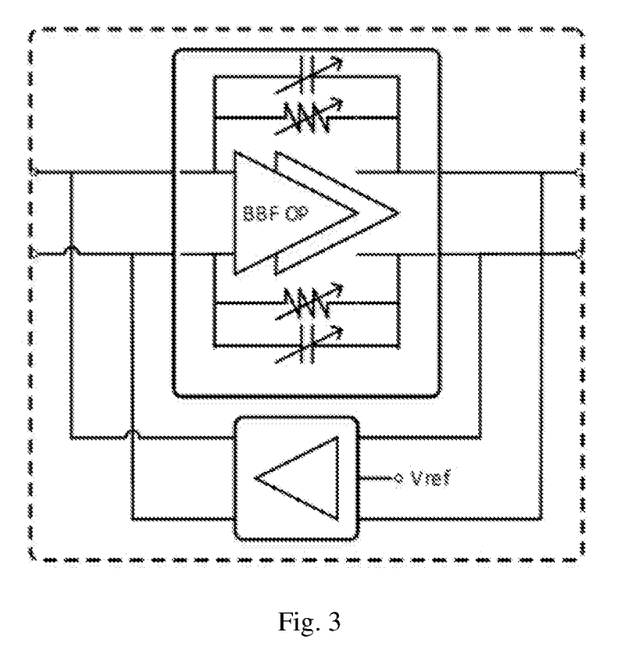
FIG. 3 shows a circuit configuration diagram of an existing CMFB.

On the other hand, since the output common-mode level in a high-gain amplifier is quite sensitive to changes in input voltage, and device characteristics and mismatch and thus cannot be stabilized by differential feedback, a common-mode feedback (CMFB) network is introduced to stabilize the common-mode level and static operating point of the circuit to thereby prevent the device from deviating from the saturated state and thus losing the amplification effect on the signal. CMFB is essentially a negative feedback network, which could detect the common-mode level of the two output terminals and adjust a bias current of the amplifier to thereby achieve the purpose of stabilizing the DC voltage. However, it is found through research that, in the arrangement of the traditional common-mode feedback circuit CMFB as shown in FIG. 3, the connection mode appears to be a loop of wrap-around type. From the perspective of chip circuit layout, in order not to affect the function of the baseband amplifier, the traditional wrap-around type requires a precise and complex structure and a large number of tests and measurements to achieve no effect on the function of the amplifier OP, otherwise the common-mode feedback circuit CMFB would affect the function of the amplifier OP.

In order to at least partially solve one or more of the above problems and other potential problems, embodiments of the present disclosure further provides an open-loop compensation circuit with a preceding common-mode loop, and an electronic system (for example, electronic module) such as a receiver or a radio frequency transceiver including the open-loop compensation circuit, the configuration of which could simplify the circuit and achieve an open-loop control with a rather simple layout, and could effectively suppress common-mode signals and thus improve the amplification efficiency.

In order to facilitate the understanding of the open-loop compensation circuit provided by the embodiments of the present disclosure, a brief description of the receiver and the radio frequency transceiver will be given first below.

Figure 4:
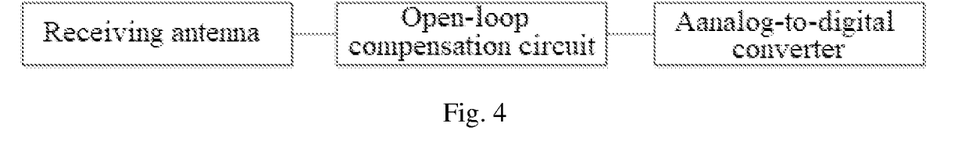
FIG. 4 shows a schematic block diagram of a receiver according to embodiments of the disclosure.

The receiver provided by embodiments of the present disclosure is an electronic module that receives radio signals from an antenna and demodulates them, mainly for receiving information such as sound, image, and positioning information. As shown in FIG. 4, the receiver herein mainly includes a receiving antenna, an open-loop compensation circuit and an analog-to-digital converter that are connected in sequence. After the receiving antenna receives signals, the open-loop compensation circuit may amplify the signals, and then the analog-to-digital converter (A/D converter) performs conversion of analog signals to digital signals.

The above-mentioned open-loop compensation circuit may also be a compensation circuit arranged after a mixer, where the mixer is usually composed of a nonlinear element and a frequency selection loop, with the frequency of its output signal being equal to the sum, difference, or other operation results of frequencies of two input signals, so as to better maintain other characteristics of the initial signal.

In front of the mixer, an attenuator may also be provided to minimize any damage to the receiver by excessive initial signal power. In addition, the receiver provided by the embodiments of the present disclosure may also be provided with other components, to adapt to different receiving requirements.

Figure 5:
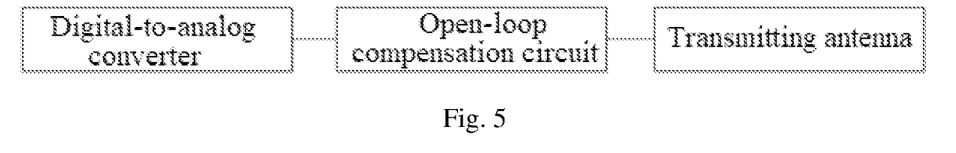
FIG. 5 shows a schematic block diagram of a radio frequency transceiver according to embodiments of the disclosure.

Corresponding to the receiver, the radio frequency transceiver provided by the embodiments of the present disclosure is an electronic module for transmitting signals, and as shown in FIG. 5, it mainly includes a digital-to-analog converter, an open-loop compensation circuit, and a transmitting antenna that are connected in sequence. Before the signals are transmitted by the transmitting antenna, conversion of digital signals to analog signals can be performed by the digital-to-analog converter (D/A converter), and then the converted signals are amplified by the open-loop compensation circuit, and then the amplified signals are transmitted through the transmitting antenna.

Similarly, the radio frequency transceiver herein may also be equipped with various components such as a mixer and an attenuator corresponding to the receiver to adapt to different transmission requirements, description of which will not be repeated here.

Considering the key functions of the open-loop compensation circuit provided by the embodiments of the present disclosure on the receiver, the radio frequency transceiver, and other various application devices, the following will focus on the description of the open-loop compensation circuit.

Figure 6:
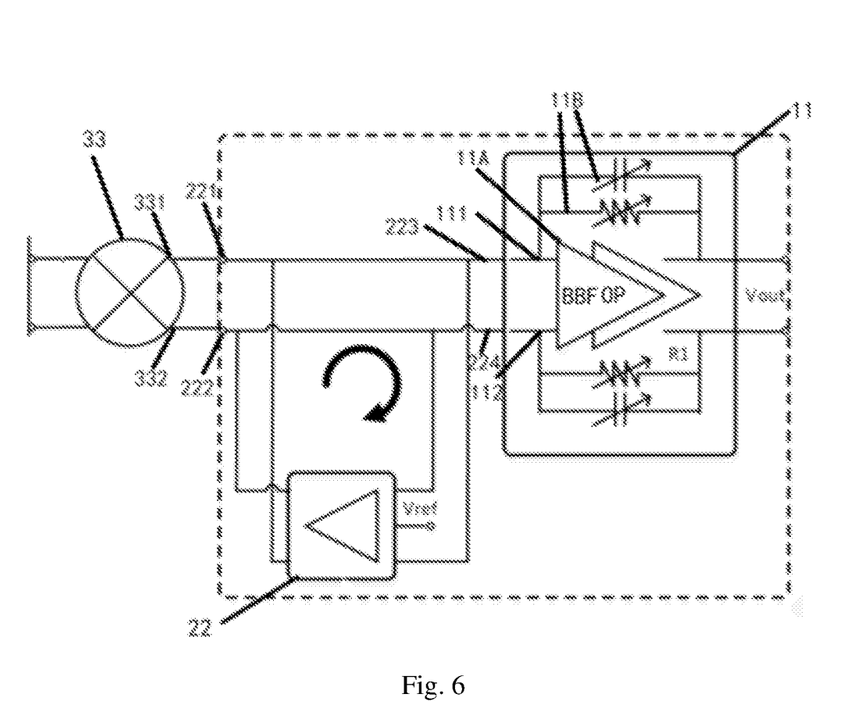
FIG. 6 shows a circuit configuration diagram of an open-loop compensation circuit according to embodiments of the disclosure.

FIG. 6 shows a circuit configuration diagram of the open-loop compensation circuit provided by the embodiments of the present disclosure. The open-loop compensation circuit includes a baseband amplifying circuit 11 (as shown in FIG. 6, including a BBF OP, that is, a baseband filter BBF and operational amplifier OP) and a common-mode compensation loop 22 connected to an input of the baseband amplifying circuit 11. The common-mode compensation loop 22 has an input connected to an output of the mixer 33, and an output connected to an input of the baseband amplifying circuit 11.

The baseband amplifying circuit 11 has a first input terminal 111 configured to receive a first input signal, and a second input terminal 112 configured to receive a second input signal.

The common-mode compensation loop 22 is configured to reversely amplify a differential signal between the first input signal and the second input signal to suppress common-mode noise.

The common-mode compensation loop 22 herein may precede the baseband amplifying circuit 11, and mainly configured to suppress common-mode noise, thereby ensuring the amplification performance of the baseband amplifying circuit 11. The amplification herein is mainly performed on the differential signal between the input signals received respectively by the two input terminals (the first input terminal 111 and the second input terminal 112), that is, the main function of the open-loop compensation circuit herein is to utilize the symmetry and negative feedback of the circuit parameters to effectively stabilize the static operating point, which is characterized by amplifying the differential mode signal and suppressing the common-mode signal.

In some embodiments, the input of the above-mentioned common-mode compensation loop 22 is directly connected to the mixer 33, so that the common-mode noise in the signal mixed by the mixer 33 can be directly suppressed. If not suppressed in advance, the common-mode noise is likely to be input into the baseband amplifying circuit 11 along with the differential signal, which is supposed to have extremely adverse effects on the baseband amplifying circuit 11.

In some embodiments, the first input terminal 221 of the common-mode compensation loop 22 is connected to the first output terminal 331 of the mixer 33, and the second input terminal 222 of the common-mode compensation loop 22 is connected to the second output terminal 332 of the mixer 33, that is, the output signal of the mixer 33 is correspondingly introduced into the common-mode compensation loop 22.

In some embodiments, the first output terminal 223 of the common-mode compensation loop 22 is connected to the first input terminal 111 of the baseband amplifying circuit 11, and the second output terminal 224 of the common-mode compensation loop 22 is connected to the second input terminal 112 of the baseband amplifying circuit 11, that is, the output of the common-mode compensation loop 22 is correspondingly introduced into the baseband amplifying circuit 11.

Figure 7:
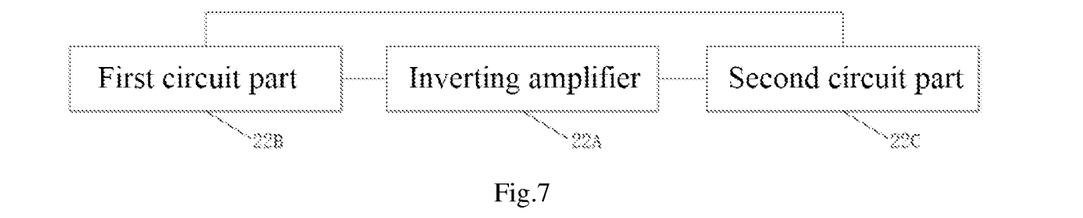
FIG. 7 shows a schematic block diagram of a common-mode compensation loop in an open-loop compensation circuit according to embodiments of the disclosure.
Figure 8:
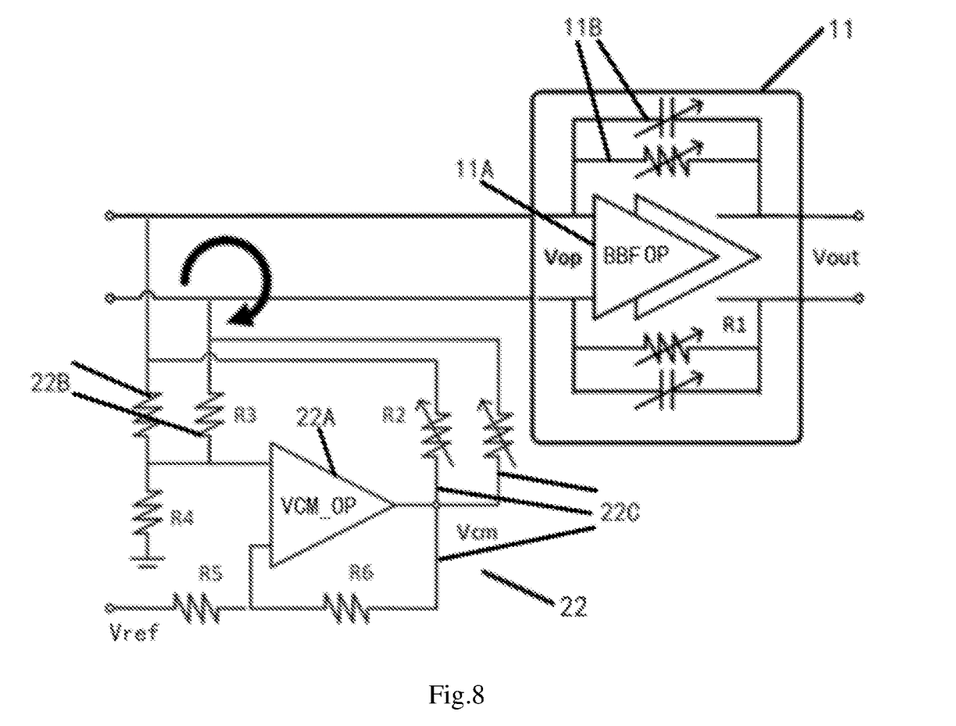
FIG. 8 shows a specific circuit configuration diagram of an open-loop compensation circuit according to embodiments of the disclosure.

As shown in FIG. 7 and FIG. 8, the common-mode compensation loop 22 in the embodiments of the present disclosure mainly includes an inverting amplifier 22A, a first circuit part 22B and a second circuit part 22C.

The first circuit part 22B has an output connected to an input of the inverting amplifier 22A.

The second circuit part 22C has an input connected to an output of the inverting amplifier 22A, where the second circuit part is a variable output circuit.

The first circuit part 22B herein is mainly configured to complete operations such as voltage division in front of the inverting amplifier 22A, and the second circuit part 22C is mainly configured to complete negative feedback.

As shown in FIG. 8, the common-mode compensation loop 22 in the embodiments of the present disclosure also includes a plurality of configured resistors that are a first resistor, a second resistor, a third resistor, a fourth resistor, a fifth resistor, and a sixth resistor, to include:

a first compensation loop configured as the first resistor and the second resistor for forming the first compensation loop with the inverting amplifier 22A;

a second compensation loop configured as the third resistor and the fourth resistor for forming the second compensation loop with the inverting amplifier 22A; and a differential part circuit configured as the fifth resistor and the sixth resistor for forming a reference voltage loop with the inverting amplifier 22A.

In order to facilitate a further understanding of the working principle of the common-mode compensation loop 22 provided by the embodiments of the present disclosure, further description may be given with reference to FIG. 8 and the following formulas.

Based on the six resistors, namely the first resistor R1, the second resistor R2, the third resistor R3, the fourth resistor R4, the fifth resistor R5, and the sixth resistor R6, three resistance coefficients, namely the first resistance coefficient K1, The second resistance coefficient K2 and the third resistance coefficient K3 can be determined.

The first resistance coefficient is defined by $$K1 = \frac{R3}{R3 + R4},$$

the second resistance coefficient is defined by $$K2 = \frac{R6}{R5},$$

and the third resistance coefficient is defined by $$K3 = \frac{R1}{R2}.$$

The inverting amplifier 22A has an output voltage Vcm determined by a differential signal Vop, a reference voltage Vref, the first resistance coefficient K1 and the second resistance coefficient K2; the baseband amplifying circuit 11 has an output voltage Vout determined by the differential signal Vop, the reference voltage Vref, the first resistance coefficient K1, the second resistance coefficient K2 and the third resistance coefficient K3.

In practical applications, the output voltage Vcm of the inverting amplifier 22A is determined by a difference between values of a first operator and a second operator, namely Vcm=first operator−second operator, where first operator=(1+K2)*Vop*K1; second operator=K2*Vref.

Herein, the output voltage of the baseband amplifying circuit 11 is determined by a sum of values of the third operator and the fourth operator, namely Vout=third operator+fourth operator, where third operator=[(1+K3)−(1+K2)*K1*K3]*Vop; fourth operator=K3*K2*Vref.

In a specific example, provided that K1=½, K2=3, K3=1, the output voltage of the baseband amplifying circuit 11 is Vout=3*Vref. It can be seen that, based on the preceding common-mode compensation loop 22 provided by the embodiments of the present disclosure, the common-mode noise could be significantly reduced, so that the signal output of the differential amplification is not affected.

As can be seen from FIG. 6 and FIG. 8, the baseband amplifying circuit 11 in the embodiments of the present disclosure mainly includes an amplifier 11A and two third circuit parts 11B, where each of the third circuit parts 11B has an input connected to an input of the amplifier 11A and an output connected to an output of the amplifier 11A, that is, the third circuit parts are connected in parallel to the amplifier.

In some embodiments, the amplifier 11A may be an operational amplifier according to the previous embodiments of the present disclosure.

In practical applications, the third circuit part 11B may include a resistor and a capacitor connected in parallel.

In the description of this specification, descriptions referring to the terms "some possible embodiments", "some embodiments", "examples", "specific examples", or "some examples" mean that the particular feature, structure, material, or characteristic described in conjunction with the embodiments or examples are included in at least one embodiment or example of the disclosure. In this specification, the schematic representations of the above terms are not necessarily directed to the same embodiment or example. Furthermore, the described specific features, structures, materials or characteristics may be combined in any suitable manner in any one or more embodiments or examples. In addition, those skilled in the art can mix and combine different embodiments or examples and features of different embodiments or examples described in this specification without conflicting with each other.

The same or similar parts between the various embodiments are not described repeatedly. Each embodiment emphasizes parts different from other embodiments.

The protection scope of the disclosure is not limited to the above embodiments. Apparently, various modifications and variations may be made to the disclosure by one skilled in the art without departing from the scope of the disclosure. If such modifications and variations belong to the claims of the disclosure and their equivalents, the disclosure intends to encompass such modifications and variations.

What is claimed is:

1. An operational amplifier, comprising at least two stages of amplification circuit units, including an output-stage amplification circuit unit and a preceding-stage amplification circuit unit at an upstream of the output-stage amplification circuit unit, wherein the output-stage amplification circuit unit comprises a pair of amplification circuits, each of which comprises a first transistor, a second transistor, a first capacitor and a first DC bias circuit, wherein
   a control electrode of the first transistor is connected with a corresponding output terminal of the preceding-stage amplification circuit unit, a first electrode of the first transistor is connected with a first power terminal, and a second electrode of the first transistor is connected with an output terminal of the amplification circuit comprising the first transistor;
   an output terminal of the first DC bias circuit is connected with a control electrode of the second transistor, to provide a DC bias voltage to the control electrode of the second transistor;
   a first electrode of the second transistor is connected with a second power terminal, and a second electrode of the second transistor is connected with the output terminal of the amplification circuit;
   two ends of the first capacitor are respectively connected with the control electrode of the first transistor and the control electrode of the second transistor so that the first capacitor connects the output terminal of the preceding-stage amplification circuit unit and the control electrode of the second transistor; and
   the first transistor and the second transistor are of opposite polarities,
   wherein the first DC bias circuit comprises a first current source and a third transistor, wherein a control electrode and a first electrode of the third transistor are both connected with the control electrode of the second transistor, a second electrode of the third transistor is connected with the second power terminal, an output terminal of the first current source is connected with the first electrode of the third transistor, and the third transistor and the second transistor are of the same polarity.

2. The operational amplifier of claim 1, wherein the amplification circuit of the output-stage amplification circuit unit further comprises a first resistor and a second capacitor, wherein the first resistor and the second capacitor are connected in series between the control electrode of the first transistor and the second electrode of the first transistor.

3. The operational amplifier of claim 1, wherein the control electrode of the third transistor is connected with the control electrode of the second transistor via a second resistor.

4. The operational amplifier of claim 1, further comprising a pair of low-frequency signal paths, each of which includes an input terminal connected with the corresponding output terminal of the preceding-stage amplification circuit unit and is configured for providing a low-frequency signal from the corresponding output terminal of the preceding-stage amplification circuit unit to the control electrode of the second transistor.

5. The operational amplifier of claim 4, wherein the low-frequency signal path comprises a fourth transistor, a fifth transistor and a second DC bias circuit, and wherein a control electrode of the fourth transistor is connected with the corresponding output terminal of the preceding-stage amplification circuit unit, a first electrode of the fourth transistor is connected with the first power terminal, a second electrode of the fourth transistor is connected with the first electrode of the third transistor; the second DC bias circuit is configured for providing a DC bias voltage to a control electrode of the fifth transistor, a first electrode of the fifth transistor is connected with the second electrode of the fourth transistor, and a second electrode of the fifth transistor is connected with the second power terminal; the fourth transistor and the first transistor have the same polarity, and the fifth transistor and the second transistor have the same polarity.

6. The operational amplifier of claim 5, wherein the operational amplifier comprises two stages of amplification circuit unit, the preceding-stage amplification circuit unit functions as an input-stage amplification circuit unit, and the second DC bias circuit comprises a sixth transistor, a seventh transistor, a third resistor and a fourth resistor;
   the resistance of the third resistor equals to that of the fourth resistor, a first end of the third resistor is connected with one output terminal of the input-stage amplification circuit unit, a second end of the fourth resistor is connected with the other output terminal of the input-stage amplification circuit unit, and a second end of the third resistor is connected with a first end of the fourth resistor;
   a control electrode of the sixth transistor is connected with the second end of the third resistor, a first electrode of the sixth transistor is connected with the first power terminal, and a second electrode of the sixth transistor is connected with a control electrode of the seventh transistor;

the control electrode of the seventh transistor is further connected with the first electrode of the seventh transistor and the control electrode of the fifth transistor, and a second electrode of the seventh transistor is connected with the second power terminal;

the polarity of the sixth transistor is the same as the polarity of the first transistor, and the polarity of the seventh transistor is the same as the polarity of the second transistor.

7. The operational amplifier of claim 6, wherein the input-stage amplification circuit unit comprises an eighth transistor, a ninth transistor, a tenth transistor, an eleventh transistor, a twelfth transistor, a thirteenth transistor, a fourteenth transistor and a third DC bias circuit, wherein a control electrode of the eighth transistor and a control electrode of the ninth transistor are respectively connected with two input terminals of the input-stage amplification circuit unit, and a first electrode of the eighth transistor and a first electrode of the ninth transistor are jointly connected with a first electrode of the twelfth transistor;

the third DC bias circuit provides a DC bias voltage to a control electrode of the twelfth transistor, and a second electrode of the twelfth transistor is connected with the second power terminal;

a control electrode of the thirteenth transistor is connected with a control electrode of the fourteenth transistor, a first electrode of the thirteenth transistor is connected with a second electrode of the ninth transistor, a first electrode of the fourteenth transistor is connected with a second electrode of the eighth transistor, a second electrode of the thirteenth transistor is connected with the first end of the third resistor, and a second electrode of the fourteenth transistor is connected with the second end of the fourth resistor;

a control electrode of the eleventh transistor is connected with a control electrode of the tenth transistor, a first electrode of the tenth transistor and a first electrode of the eleventh transistor are both connected with the first power terminal, a second electrode of the tenth transistor is connected with the second electrode of the fourteenth transistor, and a second electrode of the eleventh transistor is connected with the second electrode of the thirteenth transistor;

the polarities of the tenth transistor and the eleventh transistor are the same as the polarity of the first transistor, and the polarities of the thirteenth transistor, the fourteenth transistor, the eighth transistor, the ninth transistor and the twelfth transistor are the same as the polarity of the second transistor.

8. The operational amplifier of claim 1, wherein the first transistor is a PMOS transistor, the second transistor is an NMOS transistor, and the voltage at the first power terminal is higher than the voltage at the second power terminal.

9. An electronic system, comprising an open-loop compensation circuit which comprises a baseband amplifying circuit and a common-mode compensation loop connected to an input of the baseband amplifying circuit, the baseband amplifying circuit comprising the operational amplifier of claim 1, and the common-mode compensation loop having an input connected to an output of a mixer, and an output connected to the input of the baseband amplifying circuit, wherein the baseband amplifying circuit has a first input terminal configured to receive a first input signal, and a second input terminal configured to receive a second input signal, and the common-mode compensation loop is configured to inversely amplify a differential signal between the first input signal and the second input signal to suppress common-mode noise.

10. The electronic system of claim 9, wherein the common-mode compensation loop has a first input terminal connected to a first output terminal of the mixer, and a second input terminal connected to a second output terminal of the mixer, and has a first output terminal connected to the first input terminal of the baseband amplifying circuit, and a second output terminal connected to the second input terminal of the baseband amplifying circuit.

11. The electronic system of claim 10, wherein the common-mode compensation loop includes an inverting amplifier, a first circuit part and a second circuit part, where the first circuit part has an output connected to an input of the inverting amplifier, the second circuit part has an input connected to an output of the inverting amplifier, and the second circuit part is a variable output circuit.

12. The electronic system of claim 11, wherein the common-mode compensation loop includes:

a first compensation loop configured as a first resistor and a second resistor for forming the first compensation loop with the inverting amplifier;

a second compensation loop configured as a third resistor and a fourth resistor for forming the second compensation loop with the inverting amplifier; and a differential part circuit configured as a fifth resistor and a sixth resistor for forming a reference voltage loop with the inverting amplifier.

13. The electronic system of claim 12, wherein provided that an i-th resistor has a resistance of Ri, a j-th resistance coefficient is Kj, a first resistance coefficient is defined by $$K1 = \frac{R3}{R3 + R4},$$

a second resistance coefficient is defined by $$K2 = \frac{R6}{R5},$$

and a third resistance coefficient is defined by $$K3 = \frac{R1}{R2},$$

the inverting amplifier has an output voltage Vcm determined by a differential signal Vop, a reference voltage Vref, the first resistance coefficient K1 and the second resistance coefficient K2; the baseband amplifying circuit has an output voltage Vout determined by the differential signal Vop, the reference voltage Vref, the first resistance coefficient K1, the second resistance coefficient K2 and the third resistance coefficient K3.

14. The electronic system of claim 13, wherein the output voltage Vcm of the inverting amplifier is determined by a difference between values of a first operator and a second operator, where the first operator is expressed as (1+K2)*Vop*K1, and the second operator is expressed as K2*Vref.

15. The electronic system of claim 13, wherein the output voltage Vout of the baseband amplifying circuit is determined by a sum of values of a third operator and a fourth operator, where the third operator is expressed as [(1+K3)–(1+K2)*K1*K3]*Vop, and the fourth operator is expressed as K3*K2*Vref.

16. The electronic system of claim 9, wherein the baseband amplifying circuit further includes two third circuit parts, with each of the third circuit parts having an input connected to an input of the operational amplifier, and an output connected to an output of the operational amplifier.

17. The electronic system of claim 16, wherein each of the third circuit parts includes a resistor and a capacitor connected in parallel.

18. The electronic system of claim 9, wherein the electronic system is a receiver further including a receiving antenna and an analog-to-digital converter, wherein the receiving antenna, the open-loop compensation circuit and the analog-to-digital converter are connected in sequence.

19. The electronic system of claim 9, wherein the electronic system is a radio frequency transceiver further including a digital-to-analog converter and a transmitting antenna, wherein the digital-to-analog converter, the open-loop compensation circuit and the transmitting antenna are connected in sequence.

* * * * *